United States Patent
Kraus

(10) Patent No.: US 7,498,857 B2
(45) Date of Patent: Mar. 3, 2009

(54) CIRCUIT ARRANGEMENT AND METHOD FOR GENERATING A SQUARE WAVE SIGNAL

(75) Inventor: Randolf Kraus, Bretten (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 0 days.

(21) Appl. No.: 11/863,740

(22) Filed: Sep. 28, 2007

(65) Prior Publication Data

US 2008/0030262 A1 Feb. 7, 2008

Related U.S. Application Data

(63) Continuation of application No. PCT/EP2006/002855, filed on Mar. 29, 2006.

(30) Foreign Application Priority Data

Mar. 29, 2005 (DE) ........................ 10 2005 015 769

(51) Int. Cl.
*H03K 3/017* (2006.01)
(52) U.S. Cl. ...................................... 327/172; 327/178
(58) Field of Classification Search ......... 327/172–178, 327/100, 112
See application file for complete search history.

(56) References Cited

U.S. PATENT DOCUMENTS

| | | | |
|---|---|---|---|
| 3,916,342 A * | 10/1975 | Higuchi et al. ............... | 331/111 |
| 4,016,476 A | 4/1977 | Morokawa et al. | |
| 4,149,232 A | 4/1979 | Eaton, Jr. | |
| 6,307,407 B1 | 10/2001 | Fukui | |
| 6,472,918 B1 * | 10/2002 | Mosinskis et al. ........... | 327/175 |
| 6,933,759 B1 * | 8/2005 | Wu et al. ..................... | 327/172 |
| 6,982,574 B2 * | 1/2006 | Harriman et al. ............ | 327/108 |
| 7,057,375 B2 * | 6/2006 | Czekay et al. ............... | 323/207 |

OTHER PUBLICATIONS

International Search Report from PCT/EP2006/002855, dated Aug. 23, 2006.

* cited by examiner

Primary Examiner—Lincoln Donovan
Assistant Examiner—Hai L. Nguyen
(74) Attorney, Agent, or Firm—Alston & Bird LLP

(57) ABSTRACT

A circuit for generating a square wave signal (UN2) comprising a DC voltage source (UG), a driver stage (TS), which alternately connects a control node (SK) to ground (GND) or the DC voltage (UG), a diode (D1) and a first capacitor (C1), which are coupled in series between a first pole (P1) of the DC voltage source and the control node (SK). The circuit further comprises an output stage (AS) comprising a first transistor (TR1) and a second transistor (TR2), which are connected such that the output stage (AS) the transistors are alternately conductive. The transistors (TR1, TR2) are coupled in series between a connecting node (N1), formed between the diode (D1) and the first capacitor (C1), and the control node (SK). A connecting node (N2) between the first transistor (TR1) and the second transistor (TR2) forms an output terminal for emitting the square wave signal.

7 Claims, 1 Drawing Sheet

CIRCUIT ARRANGEMENT AND METHOD FOR GENERATING A SQUARE WAVE SIGNAL

CROSS REFERENCE TO RELATED APPLICATIONS

This application is a continuation of PCT/EP2006/002855, filed Mar. 29, 2006, which in turn claims priority to DE 10 2005 015 769.6, filed on Mar. 29, 2005, the contents of both of which are incorporated by reference.

FIELD OF APPLICATION

The invention relates to a circuit arrangement and to a method for generating a square wave signal.

BACKGROUND

There is a frequent need in the case of electronic circuits for square wave signals, whose amplitude is higher than the value of a supply voltage of the electronic circuit.

Such a square wave signal can be generated in that in addition to a first supply voltage source, e.g. with an output voltage of 5V, a second voltage source is provided, e.g. with an output voltage of 10V. For generating the square wave signal, which alternates between a ground or earth voltage and 10V, a series resistor and a transistor are looped or coupled in series between the second voltage source and the ground voltage, being controlled by a microprocessor supplied with 5V with a 5V amplitude square wave signal. The output voltage is applied at a connection point between the series resistor and the transistor. If the transistor blocks or switched off, the output voltage is 10V, less the voltage decreasing at the series resistor. If the transistor is switched on, the output voltage is the transistor forward voltage, i.e., approximately 0V. However, due to the series resistor the higher output voltage value is highly load-dependent, because a load current causes a corresponding voltage drop at the series resistor. To reduce this load dependence, the series resistor should have a relatively low resistance. However, when the transistor is switched on, this gives rise to a high current, which flows across the transistor to earth in unused form. It is also necessary to have a second voltage source, so that the circuitry costs, space requirements and manufacturing costs of the circuit arrangement increase.

The technical problem of the invention is the provision of a circuit arrangement and a method for generating a square wave signal of the aforementioned type, which provide an output signal with lower load dependence and which can be inexpensively implemented with limited space requirements.

BRIEF DESCRIPTION OF THE DRAWINGS

An advantageous embodiment of the invention is diagrammatically shown in the drawings and is described in greater detail hereinafter with respect to said drawings, wherein.

DETAILED DESCRIPTION OF THE EMBODIMENT

Figure 1:
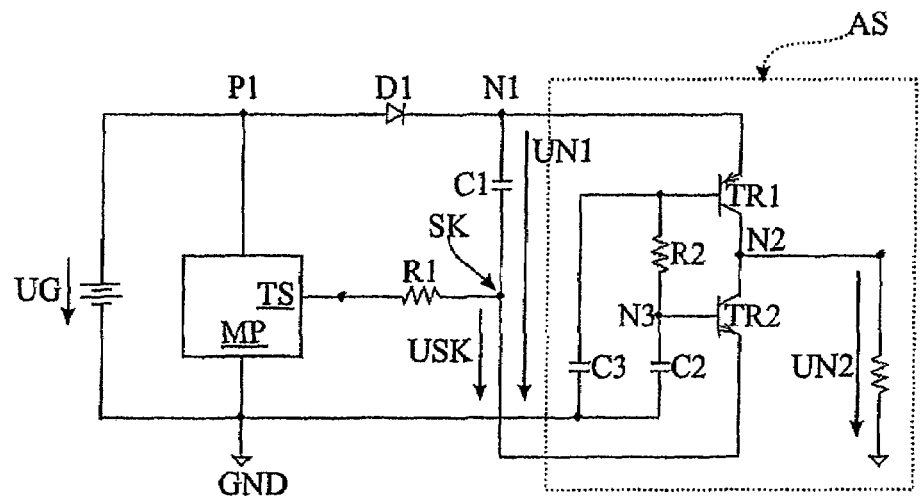
FIG. 1 illustrates a circuit diagram of one embodiment of a circuit arrangement for generating a square wave signal.

The invention solves this problem in one embodiment by a circuit arrangement having the features of claim 1 and a method having the features of claim 7. Advantageous and preferred embodiments of the invention form the subject matter of the sub claims and are explained in greater detail hereinafter. By express reference the wording of the claims is made into part of the content of the description. Some of the features and characteristics listed hereinafter relate both to the circuit arrangement and the method. In part they are only described once, but independently of this they apply both to the circuit arrangement and the method.

According to the invention the circuit arrangement for generating a square wave signal comprises a DC voltage source for generating a DC voltage, a driver stage, which is arranged for alternately connecting a control node to a reference potential or the DC voltage, a diode and a first capacitor, which are coupled in series between a first pole of the DC voltage source and the control node. The circuit also comprises an output stage with a first and a second controllable switching means wired in such a way that they are alternately conductive in the operation of the output stage. The switching means are coupled in series between a connecting node between the diode and the first capacitor and the control node. A connecting node between the first and the second switching means forms an output terminal for emitting the square wave signal, in other words, said square wave signal is present thereto. The driver stage, the diode and the first capacitor form a voltage doubler unit, which upwardly displaces a square wave voltage generatable at the driver stage and which alternates between the DC voltage and the reference potential by the value of said DC voltage. Thus, at the connecting point between the diode and the first capacitor, there is a square wave voltage alternating between the DC voltage on the one hand and roughly twice the DC voltage on the other. This square wave voltage is then supplied to the output stage.

As a result of the wiring of the output stage, the first switching means conducts, whereas the second switching means blocks when the displaced square wave signal has its higher value. Therefore the higher value of the displaced square wave voltage, i.e. roughly twice the DC voltage, is applied to the output terminal. The first switching means blocks and the second switching means becomes conductive if the displaced square wave value has its lower value, i.e. is roughly the same as the DC voltage. As the second switching means is connected to the driver stage and the driver stage is presently switched through against the reference potential, the output terminal is also switched through against the reference potential. Thus, at the output terminal there is an output signal in the form of a square wave voltage, which roughly alternates between the reference voltage and twice the DC voltage. This is achieved without a voltage source being needed for this purpose. The output signal advantageously has a low load dependence, because only a low internal resistance of the output terminal occurs due to the low resistance coupling via the switching means. As no second voltage source is needed, the circuit arrangement can be inexpensively implemented with limited space requirements.

In one construction of the circuit arrangement it comprises a microprocessor, the drive stage being an output terminal of said microprocessor. With the aid of an output terminal of a microprocessor, the output terminal can be connected either in a low resistance manner to the microprocessor reference voltage or to its supply voltage. This means that at the microprocessor output terminal a square wave voltage in a wide frequency range can be easily generated. This can be software side-adapted to given boundary conditions, e.g. the necessary frequency of the square wave voltage.

According to a further embodiment of the circuit arrangement, a series resistor is provided between the control node and the driver stage to protect the latter. The series resistor is to be dimensioned in such a way that damage to the terminal is prevented and at the same time the resulting internal resistance of the output serving as the square wave voltage source remains low enough in order to ensure a reliable circuit arrangement function.

In an advantageous further development of the circuit arrangement the first switching means is a first bipolar transistor and the second switching means a second bipolar transistor. Due to the diode regions between the given base and the given emitter, through the use of bipolar transistors, a voltage clamping effect occurs which can be used for automatically controlling the transistors. This means that in the case of a suitable base-side wiring as a result of the diode regions, a desired control or base voltage of the transistors is automatically obtained. In order to ensure such an automatic control, as the base-side wiring a resistor and a second capacitor is preferably coupled in series between a base terminal of the first transistor and the reference potential, the second capacitor being connected to the reference potential. A connecting node between the resistor and the second capacitor is connected to a base terminal of the second transistor. In addition, a third capacitor is coupled between the base terminal of the first transistor and reference potential. Preferably the first and second transistors are complimentary transistors. This makes it possible in a simple manner to bring about a complimentary switching behaviour of the transistors.

The inventive method comprises the steps:
generating a DC voltage,
generating a first square wave voltage from the DC voltage,
   i. which alternates between the DC voltage and a reference voltage,
   ii. particularly the ground voltage,
generating a second square wave voltage from the first square wave
   i. voltage, which alternates between a multiple, particularly twice
   ii. the DC voltage and the DC voltage,
outputting the second square wave voltage if it is higher than the
   i. DC voltage or
outputting the reference potential if the second square wave
   i. voltage is equal to the DC voltage.

These and further features can be gathered from the claims, description and drawings and the individual features, both singly or in the form of subcombinations, can be implemented in an embodiment of the invention or in other fields and can represent advantageous, independently protectable embodiments for which protection is claimed. The subdivision of the application into individual sections and the subheadings in no way restrict the general validity of the statements made thereunder.

FIG. 1 shows a circuit arrangement for generating a square wave signal UN2 with a DC voltage source for generating a DC voltage UG, a microprocessor MP supplied by DC voltage UG and having an output terminal serving as a driver stage TS. Through said driver stage TS a control node SK is alternately connected to a reference potential GND or the DC voltage UG. A diode D1 and a first capacitor C1 are provided, which are coupled in series between a first pole P1, here the positive pole, of the DC voltage source and the control node SK. A series resistor R1 is provided between the control node SK and the driver stage TS for protecting the latter and for limiting the current in the case of switching processes of the driver output. However, it is chosen with a low resistance and can be ignored when considering operation. Finally there is an output stage AS, formed by the right-hand part of the circuit.

Said output stage AS comprises a bipolar pnp transistor TR1 and a complimentary, bipolar npn transistor TR2, which are coupled in series between a first connecting node N1 between diode D1 and the first capacitor C1 and the control node SK. A connecting node N2 between transistors TR1 and TR2 serves as the output terminal for emitting square wave signal UN2. Between a base terminal of transistor TR1 and reference terminal GND are coupled in series a resistor R2 and a second capacitor C2, the latter being connected to reference potential GND. A connecting node N3 between resistor R2 and the second capacitor C2 is connected to a base terminal of the second transistor TR2. Additionally a third capacitor C3 is coupled between the base terminal of the first transistor TR1 and reference potential GND. Capacitor C2 in conjunction with R2 and capacitor C3 are used for automatically generating the base voltages of transistors TR1, TR2 respectively, i.e., capacitors C2 and C3 fundamentally serve the same function. Output stage AS is symmetrical, i.e. transistors TR1 and TR2 have a symmetrical switching behaviour.

Output stage AS functions in push-pull operation, i.e., transistors TR1 and TR2 become alternately conductive. Transistors TR2 and TR1 are operated in a base circuit arrangement. The base voltages of transistors TR1 and TR2 are generated by capacitors C2 and C3 and the charging resistor R2. The base voltages necessary for operation are generated automatically, because they are limited by the clamping action of the base-emitter region of transistors TR1 and TR2. As transistors TR1 and TR2 are operated in a symmetrical base circuit, the output stage AS has a high bandwidth and a symmetrical output signal UN2.

Figure 2:
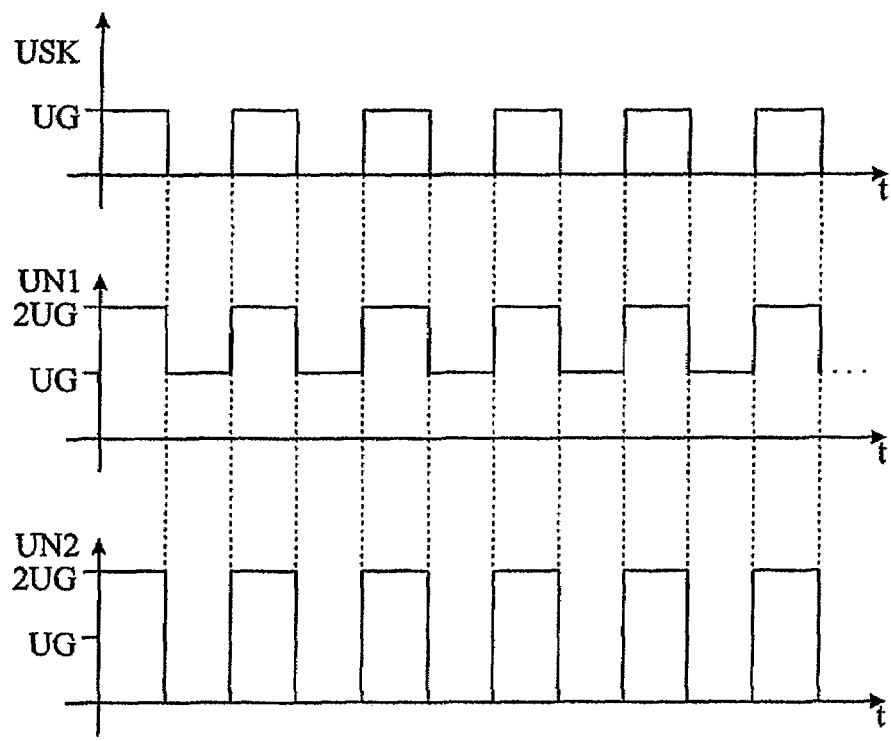
FIG. 2 illustrates a diagram of the signals of the circuit arrangement of FIG. 1.

FIG. 2 shows a diagram of signals of the circuit arrangement of FIG. 1. Driver stage TS, diode D1 and first capacitor C1 form a voltage doubler circuit, which upwardly displaces a square wave voltage USK generatable at the driver stage by the DC voltage value. Square wave voltage USK alternates between DC voltage UG and reference potential GND, as shown in FIG. 2. The thus displaced square wave voltage UN1 applied to node N1 is also shown in FIG. 2. Voltage UN1 alternates between roughly twice the DC voltage UG and the value of said DC voltage UG. The forward voltage decreasing at diode D1 is ignored.

Square wave voltage UN1 is supplied to the output stage AS. Due to the wiring of the output stage AS transistor TR1 conducts and transistor TR2 blocks when voltage UN1 has its higher value, i.e., is approximately 2 UG. Thus, roughly twice the DC voltage UG is applied to the output terminal.

If voltage UN1 is roughly equal to voltage UG, the first transistor TR1 blocks and the second transistor TR2 becomes conductive. As transistor TR2 or its emitter is connected to driver stage TS and the latter is instantaneously switched through against the reference potential GND, the output terminal or node N2 is also switched through against the reference potential GND.

Thus, at node N2 occurs the output signal UN2 in the form of a square wave voltage, which alternates roughly between twice the DC voltage UG and reference voltage GND.

In summarizing, once again the operating principle of the circuit arrangement is explained. From the DC voltage UG a first square wave voltage USK is generated, which alternates between DC voltage UG and ground voltage GND, as shown in FIG. 2. From the first square wave voltage USK a second square wave voltage UN1 is generated, which alternates between twice the DC voltage UG and said DC voltage UG, as is also shown in FIG. 2. The second square wave voltage UN1 is outputted at node N2 if it is higher than the DC voltage UG, i.e. twice UG. Otherwise the reference potential GND is outputted at node N2. Output voltage UN2 shown in FIG. 2 occurs at node N2.

Therefore there is generated an output voltage swing of approximately twice UG without requiring an additional voltage source with an output voltage of twice UG. The output signal also exhibits a low load dependence, because there is only a low internal resistance of the output terminal due to the low resistance coupling via switching means. As no second voltage source is needed, the circuit arrangement can be implemented inexpensively with limited space requirements.

The invention claimed is:

1. A circuit arrangement for generating a square wave signal (UN2) having
    a DC voltage source for generating a DC voltage (UG);
    a driver stage (TS) arranged for alternately coupling a control node (SK) to a reference potential (GND) or the DC voltage (UG);
    a diode (D1) and a first capacitor (C1) coupled in series between a first pole (P1) of the DC voltage source and the control node (SK); and
    an output stage (AS) with a first controllable switching means (TR1) and a second controllable switching means (TR2) wired in such a way that in operation of the output stage (AS) they are alternately conductive,
    wherein the switching means (TR1, TR2) being coupled in series between a connecting node (N1), formed between the diode (D1) and the first capacitor (C1), and the control node (SK), and
    wherein a connecting node (N2), formed between the first switching means (TR1) and the second switching means (TR2), forms an output terminal for emitting the square wave signal.

2. The circuit arrangement according to claim 1, characterized in that it comprises a microprocessor (MP), the driver stage being an output terminal of the microprocessor.

3. The circuit arrangement according to claim 1, characterized in that a series resistor (R1) is provided between the control node and the driver stage for protecting the driver stage.

4. The circuit arrangement according to claim 1, characterized in that the first switching means is a first bipolar transistor (TR1) and the second switching means is a second bipolar transistor (TR2).

5. The circuit arrangement according to claim 4, characterized in that the first and second transistors are complimentary transistors.

6. The circuit arrangement according to claim 4, characterized in that between a base terminal of the first transistor and the reference potential a resistor (R2) and a second capacitor (C2) are coupled in series, wherein a connecting node (N3) between the resistor (R2) and the second capacitor (C2) is connected to a base terminal of the second transistor, and additionally a third capacitor (C3) is coupled between the base terminal of the first transistor and the reference potential.

7. A method for generating a square wave signal comprising the steps of:
    generating a DC voltage (UG);
    generating a first square wave voltage (USK) from the DC voltage (UG), which alternates between the DC voltage (UG) and a reference potential, particularly the ground potential (GND);
    generating a second square wave voltage (UN1) from the first square wave voltage (USK), which alternates between a multiple of the DC voltage (UG), at least at twice the DC voltage (UG), and the DC voltage (UG); and
    emitting the second square wave voltage (UN1) when the second square wave voltage (UN1) is higher than the DC voltage (UG), or emitting the reference potential (GND) when the second square wave voltage (UN1) is equal to the DC voltage (UG).

* * * * *